(12) United States Patent
Fukunaga et al.

(10) Patent No.: US 7,179,503 B2
(45) Date of Patent: Feb. 20, 2007

(54) METHOD OF FORMING THIN METAL FILMS ON SUBSTRATES

(75) Inventors: Akira Fukunaga, Tokyo (JP); Hiroshi Nagasawa, Tokyo (JP); Takao Kato, Tokyo (JP)

(73) Assignee: Ebara Corporation, Tokyo (JP)

( * ) Notice: Subject to any disclaimer, the term of this patent is extended or adjusted under 35 U.S.C. 154(b) by 536 days.

(21) Appl. No.: 10/464,551

(22) Filed: Jun. 19, 2003

(65) Prior Publication Data

US 2003/0224104 A1 Dec. 4, 2003

Related U.S. Application Data

(62) Division of application No. 09/733,084, filed on Dec. 11, 2000, now abandoned.

(30) Foreign Application Priority Data

| Dec. 9, 1999 | (JP) | ................. 11-350324 |
| Dec. 9, 1999 | (JP) | ................. 11-350325 |
| Jan. 6, 2000 | (JP) | ................. 2000-001009 |

(51) Int. Cl.
  *B05D 5/12* (2006.01)
  *B05D 3/02* (2006.01)
(52) U.S. Cl. ............... 427/205; 427/226; 427/229; 427/96.1
(58) Field of Classification Search ........ 427/205, 427/226, 229, 96.1
See application file for complete search history.

(56) References Cited

U.S. PATENT DOCUMENTS

| 3,814,696 | A | 6/1974 | Verdone et al. |
| 4,186,244 | A | 1/1980 | Defferyes et al. |
| 4,657,187 | A | 4/1987 | Hayashi |
| 4,683,118 | A | 7/1987 | Hayashi et al. |
| 4,877,647 | A | 10/1989 | Klabunde |
| 5,882,722 | A | 3/1999 | Kydd |
| 5,885,716 | A | 3/1999 | Nagasawa et al. |
| 5,980,636 | A | 11/1999 | Okumura |
| 5,993,546 | A | 11/1999 | Sugai |
| 6,280,802 | B1 | 8/2001 | Akedo et al. |
| 6,358,611 | B1 | 3/2002 | Nagasawa et al. |
| 6,861,096 | B2* | 3/2005 | Aono et al. ........... 427/261 |
| 2004/0194689 | A1* | 10/2004 | Sung .................... 117/63 |

FOREIGN PATENT DOCUMENTS

| EP | 0 331 022 | 9/1989 |
| EP | 0 417 294 | 3/1991 |
| EP | 0 449 309 | 10/1991 |
| EP | 0 740 324 | 10/1996 |
| JP | 08 259268 | 10/1996 |

\* cited by examiner

*Primary Examiner*—Fred J. Parker
(74) *Attorney, Agent, or Firm*—Browdy and Neimark, PLLC

(57) ABSTRACT

A solution containing a metal component of composite ultrafine metal particles each having a core substantially made of metal component and a covering layer made of an organic compound chemically bonded to the core having an average diameter ranging from 1 to 10 nm, uniformly dispersed in a solvent, forms a thin metal film on the surface of a transfer sheet, after which the transfer sheet, after which the transfer sheet is thermally decomposed to transfer the thin metal film to a substrate.

9 Claims, 11 Drawing Sheets

F I G. 2A
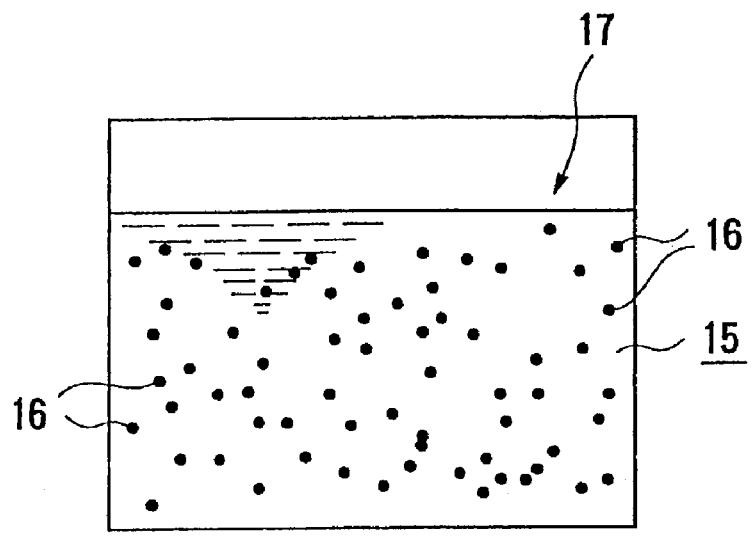
F I G. 2B
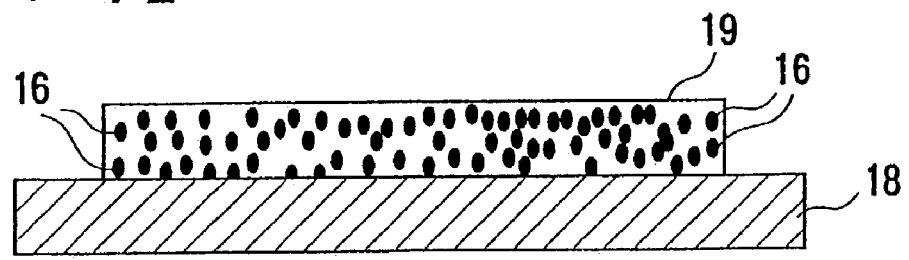
F I G. 2C
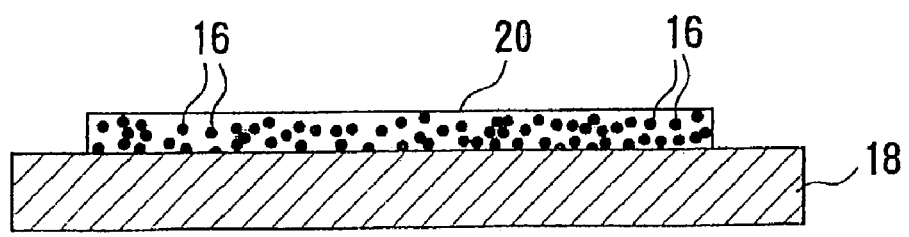

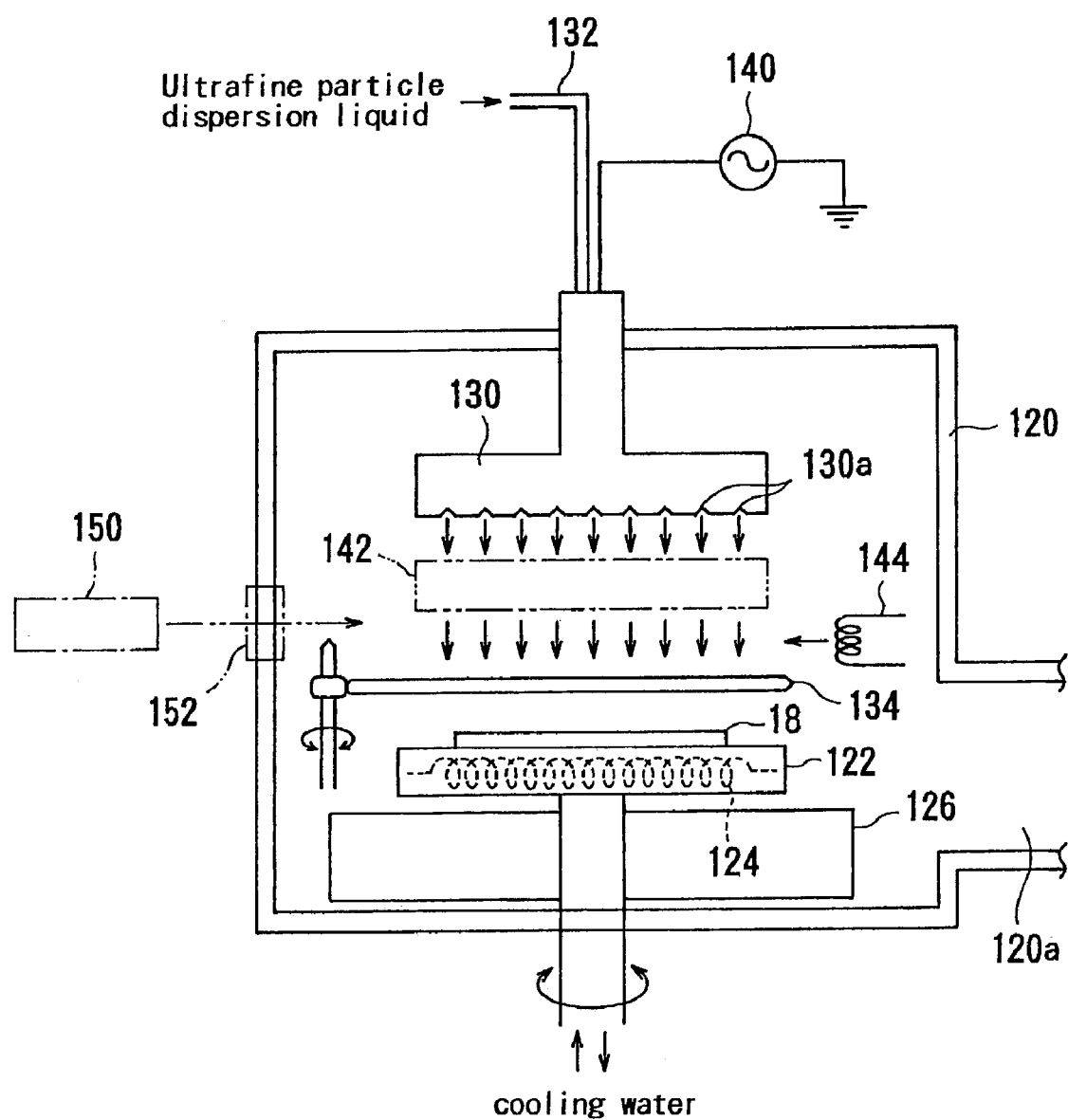

F I G. 1 3 A 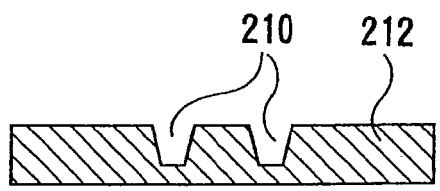
F I G. 1 3 B 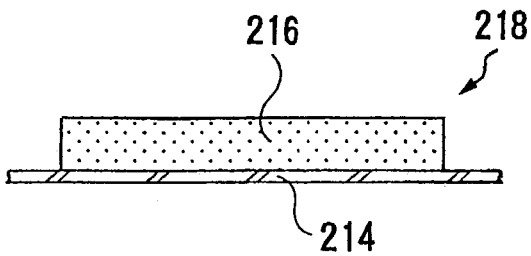
F I G. 1 3 C 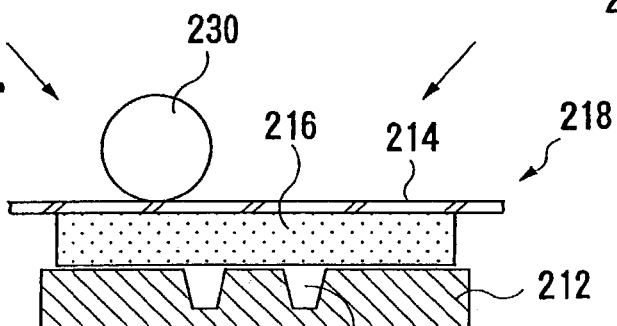
F I G. 1 3 D 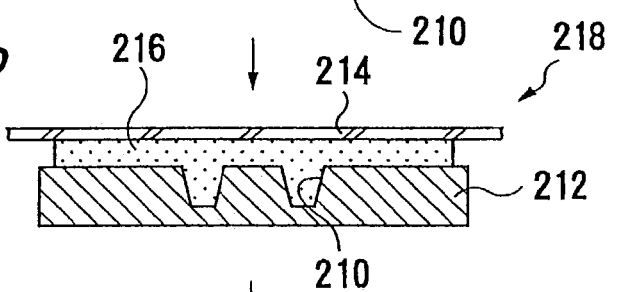
F I G. 1 3 E 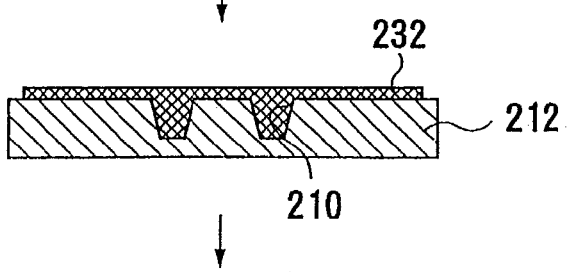
F I G. 1 3 F 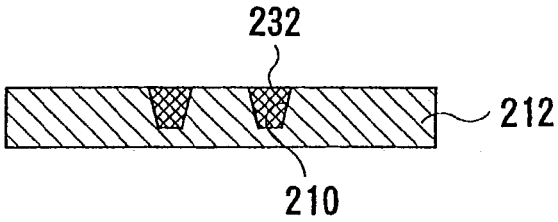

METHOD OF FORMING THIN METAL FILMS ON SUBSTRATES

This is a division of co-pending parent application Ser. No. 09/733,084 filed Dec. 11, 2000, now abandoned.

BACKGROUND OF THE INVENTION

1. Field of the Invention

The present invention relates to a solution containing a metal component, and a method of and an apparatus for forming a thin metal film, and more particularly to a solution containing a metal component for use in forming a conductive thin metal film on a semiconductor substrate of silicon or the like, and a method of and an apparatus for forming a thin metal film using such a solution, and a method of and an apparatus for forming a thin metal film in embedding a conductive metal such as copper (Cu) or the like in minute interconnection recesses defined in the surface of a substrate of silicon or the like thereby forming interconnections.

2. Description of the Related Art

Aluminum or aluminum alloys are generally used as metal materials for forming interconnection circuits on semiconductor substrates. One recent trend is to use copper as such a metal material for forming interconnection circuits. Since copper has an electric resistivity of 1.72 $\mu\Omega$cm which is about 40% lower than aluminum, it is more effective to prevent signal delays. In addition, because copper has much better electromigration resistance than presently available aluminum and can be embedded more easily into minute recesses by the dual damascene process than aluminum, it allows complex and minute multilayer interconnection structures to be manufactured relatively inexpensively.

Metal such as copper or the like can be embedded into interconnection grooves and via holes by the dual damascene process according to three methods, i.e., CVD, sputtering reflow, and plating. Of these methods, the plating method has a stronger tendency to be able to form highly conductive paths with a relatively easy and inexpensive process, because conductive material can be embedded more easily into minute recesses by the plating, making it customary to incorporate a design rule of 0.18 $\mu$m generation into semiconductor mass-production lines.

FIGS. 16A through 16C show a basic process for plating the surface of a semiconductor substrate with copper to produce a semiconductor device with copper interconnections. As shown in FIG. 16A, an insulating film 2 of $SiO_2$ is deposited on a conductive layer 1a on a semiconductor base 1 with semiconductor elements formed thereon. A small recess 5 comprising a contact hole 3 and an interconnection groove 4 is formed in the insulating film 2 by lithography and etching. A diffusion barrier layer 6 made of TaN or the like and a base film 7 as a seed layer for supplying an electric current for electroplating are successively formed on the surface formed so far.

As shown in FIG. 16B, the entire surface of the substrate 18 is plated with copper according to electrolytic copper plating to fill the recess 5 with a copper layer 8 and deposit a copper layer 8 on the base film 7. Thereafter, the surface formed so far is polished by chemical mechanical polishing (CMP) to remove the base film 7, the copper layer 8 thereon, and the diffusion barrier layer 6, and planarize the copper layer 8 filled in the contact hole 3 and the interconnection groove 4 flush with the insulating film 2. In this manner, an embedded interconnection made of the copper layer 8 is formed as shown in FIG. 16C.

The base film 7 (seed layer) is formed prior to the electrolytic copper plating because its surface will serve as an electric cathode for supplying a sufficient current to reduce metal ions by reduction in the electrolytic solution and to precipitate them as a metal solid. The surface of the substrate may be plated with copper according to electroless copper plating. According to the electroless copper plating, it is the widespread practice to employ a catalytic layer as the base film 7 instead of the seed layer.

Other general known method of forming a conductive thin metal film on a ceramic substrate comprises the steps of coating (printing) a metal paste such as an Ag—Pd-based paste, a silver-based paste, or the like on the surface of the substrate, and then baking the coated metal paste. The metal paste is generally in the form of a solution that comprises a metal powder of silver, copper, or the like and a resin or glass component which are dispersed in an organic solvent. The resin or glass component enables the paste to be formed as a film, and the particles of the metal powder are held in point-to-point contact to make the thin metal film electrically conductive.

To meet demands in recent years for higher-speed and finer-circuit semiconductor devices, there is a need for growing films of materials that are poorly evaporated by CVD, and a pattern is produced which is too small to be embedded by sputtering. While the plating technology is inexpensive and technically highly complete, the electrolytic plating process allows films to be grown on only conductive materials, and the electroless plating process is open to environmental pollution as materials contained in the plating solution adversely affect the natural environment and the working and labor environment. For these reasons, there has been a strong demand for a new film growing technique in place of the conventional film growing technique.

If a thin metal film is formed of a conventional metal paste as interconnections on a ceramic substrate, then the conductivity is limited to a certain level because the thin metal film is rendered conductive by point-to-point contact between metal particles. To increase the conductivity, the thickness of the thin metal film needs to be increased to provide more sites of-point-to-point contact between metal particles. The thicker metal film is more expensive to manufacture.

There has been developed a dispersion liquid comprising ultrafine metal particles dispersed in an organic solvent. However, available processes of producing ultrafine metal particles are of low productivity. One example of such processes is a gas evaporation process in which is metal is evaporated under vacuum in the presence of a small amount of gas to aggregate ultrafine particles made of only the metal from the gas phase. The processes of producing ultrafine metal particles also disadvantageous in that it is difficult to keep the ultrafine particles in safe storage because once the solvent is evaporated, the particles stick to each other and cannot be reused.

SUMMARY OF THE INVENTION

It is therefore an object of the present invention to provide a solution containing a metal component for use in inexpensively and easily forming a conductive thin metal film which has a sufficient conductivity and whose thickness can easily be adjusted, and a method of and an apparatus for forming a thin metal film using such a solution.

Another object of the present invention to provide a method of and an apparatus for stably forming a thin metal film of good quality on a surface of a base to embed a conductor reliably in fine interconnection recesses that are defined in a surface of a substrate, for example.

According to an aspect of the present invention, there is provided a solution containing a metal component, comprising composite ultrafine metal particles each having a core substantially made of a metal component and a covering layer made of an organic compound chemically bonded to the core; wherein the core has an average diameter ranging from 1 to 10 nm; and the composite ultrafine metal particles are uniformly dispersed in a solvent.

It is known in the art that the melting point of a metal particle is lower as the diameter of the metal particle is smaller. The effect starts to develop when the diameter of the metal is 50 nm or smaller, and becomes apparent particularly when the diameter of the metal is 20 nm or smaller, or more evident when the diameter of the metal is 10 nm or smaller. Therefore, cores substantially made of a metal component and having an average diameter ranging from 1 to 20 nm, preferably from 1 to 10 nm, are melted and joined together at a temperature considerably lower than the melting point of the metal component itself.

It is believed that the composite ultrafine metal particles are bonded such that the cores and the organic compound share metal molecules or make an ionic bond to form a complex-like structure, although no details of such a bonded structure are clearly given. Since the composite ultrafine metal particles can be produced according to a chemical process in a liquid phase, they can be mass-produced inexpensively in the ordinary atmosphere with a simple apparatus without the need for a large-scale vacuum system. Because the composite ultrafine metal particles are of a uniform particle diameter, all the composite ultrafine metal particles are fused together at a constant temperature. Since the cores are covered with the organic compound, the aggregation of the composite ultrafine metal particles is small, and hence the composite ultrafine metal particles can uniformly be distributed over a surface of a substrate. The composite ultrafine metal particles are also stable and can be handled with ease. Even after the solvent is evaporated, the composite ultrafine metal particles remain chemically stable until they are thermally decomposed. Therefore, the process control for the processing of the composite ultrafine metal particles is facilitated.

According to another aspect of the present invention, there is provided a solution containing a metal component, comprising composite ultrafine metal particles each having a core substantially made of a metal component and a covering layer made of an organic compound chemically bonded to the core; wherein the core has an average diameter ranging from 1 to 50 nm; and the composite ultrafine metal particles are uniformly dispersed in a solvent.

According to still another aspect of the present invention, there is provided a solution containing a metal component, comprising: at least one of composite ultrafine metal particles and an organic metal compound; and a metal powder having an average particle diameter ranging from 1 to 10 μm; wherein each of the composite ultrafine metal particles has a core substantially made of a metal component and a covering layer made of an organic compound chemically bonded to the core; the core has an average diameter ranging from 1 to 10 nm; and the at least one of the composite ultrafine metal particles and the organic metal compound and the metal powder are uniformly dispersed in a solvent.

With this arrangement, the proportion of the metal component in the solution can be increased by the metal powder which is relatively inexpensive. Further, the metal powder serves as a skeleton and a conductor, and at least one of the composite ultrafine metal particles and the organic metal compound serves as a binder, preventing the solution from being lowered in conductivity.

According to yet another aspect of the present invention, there is provided a solution containing a metal component, comprising: at least one of composite ultrafine metal particles and an organic metal compound; and a metal powder having an average particle diameter ranging from 1 to 10 μm; wherein each of the composite ultrafine metal particles has a core substantially made of a metal component and a covering layer made of an organic compound chemically bonded to the core; the core has an average diameter ranging from 1 to 50 nm; and the at least one of the composite ultrafine metal particles and the organic metal compound and the metal powder are uniformly dispersed in a solvent.

According to yet still another aspect of the present invention, there is provided a method of forming a thin metal film, comprising: preparing a solution containing a metal component, comprising composite ultrafine metal particles each having a core substantially made of a metal component and a covering layer made of an organic compound chemically bonded to the core, the core having an average diameter ranging from 1 to 10 nm, the composite ultrafine metal particles being uniformly dispersed in a solvent; bringing the solution into contact with a surface of a substrate; evaporating the solvent in the solution on the surface of the substrate to form an ultrafine particle coating layer on the surface of the substrate; and thermally decomposing the ultrafine particle coating layer into a thin metal film having a thickness ranging from 0.01 to 10 μm.

The above method is capable of forming a thin metal film uniformly over the surface of the substrate, which is composed of only cores (metal component) contained in the composite ultrafine metal particles and having a relatively small thickness.

In the above method, the metal component in the solution has a total amount ranging from 30 to 90 weight %. The thickness of the thin metal film can be adjusted by adjusting the total amount of the metal component in the solution.

According to a further aspect of the present invention, there is provided a method of forming a thin metal film, comprising: preparing a solution containing a metal component, comprising composite ultrafine metal particles each having a core substantially made of a metal component and a covering layer made of an organic compound chemically bonded to the core, the core having an average diameter ranging from 1 to 50 nm, the composite ultrafine metal particles being uniformly dispersed in a solvent; bringing the solution into contact with a surface of a substrate; evaporating the solvent in the solution on the surface of the substrate to form an ultrafine particle coating layer on the surface of the substrate; and thermally decomposing the ultrafine particle coating layer into a thin metal film having a thickness ranging from 0.01 to 10 μm.

In the above method, the metal component in the solution has a total amount ranging from 30 to 90 weight %.

According to a still further aspect of the present invention, there is provided a method of forming a thin metal film, comprising: preparing a solution containing a metal component, comprising at least one of composite ultrafine metal particles and an organic metal compound, and a metal powder having an average particle diameter ranging from 1 to 10 μm; bringing the solution into contact with a surface of a substrate; evaporating the solvent in the solution on the surface of the substrate to form an ultrafine particle coating layer on the surface of the substrate; and thermally decomposing the ultrafine particle coating layer into a thin metal film having a thickness ranging from 10 to 1000 μm; wherein each of the composite ultrafine metal particles has a core substantially made of a metal component and a covering layer made of an organic compound chemically bonded to the core; the core has an average diameter ranging from 1 to 10 nm; and the at least one of the composite ultrafine metal particles and the organic metal compound and the metal powder are uniformly dispersed in a solvent.

With the above method, the thickness of the thin metal film can be increased by the metal powder. The ultrafine metal particles that are formed by reducing the cores (metal component) of the composite ultrafine metal particle or the organic metal compound are melted and joined by thermal decomposition. At this time, at least one of the ultrafine metal particles and the organic metal compound are closely bonded to the metal powder to achieve high conductivity.

In the above method, the metal component in the solution has a total amount ranging from 30 to 90 weight %.

According to a yet still further aspect of the present invention, there is provided a method of forming a thin metal film, comprising: preparing a solution containing a metal component, comprising at least one of composite ultrafine metal particles and an organic metal compound, and a metal powder having an average particle diameter ranging from 1 to 10 μm; bringing the solution into contact with a surface of a substrate; evaporating the solvent in the solution on the surface of the substrate to form an ultrafine particle coating layer on the surface of the substrate; and thermally decomposing the ultrafine particle coating layer into a thin metal film having a thickness ranging from 10 to 1000 μm; wherein each of the composite ultrafine metal particles has a core substantially made of a metal component and a covering layer made of an organic compound chemically bonded to the core; the core has an average diameter ranging from 1 to 50 nm; and the at least one of the composite ultrafine metal particles and the organic metal compound and the metal powder are uniformly dispersed in a solvent.

In the above method, the metal component in the solution has a total amount ranging from 30 to 90 weight %.

According to another aspect of the present invention, there is provided an apparatus for forming a thin metal film, comprising: a solution supply device for bringing a solution containing a metal component into contact with a surface of a substrate, the solution comprising composite ultrafine metal particles each having a core substantially made of a metal component and a covering layer made of an organic compound chemically bonded to the core, the composite ultrafine metal particles being uniformly dispersed in a solvent; and a heating device for evaporating the solvent in the solution on the surface of the substrate to form an ultrafine particle coating layer on the surface of the substrate, and thermally decomposing the ultrafine particle coating layer into a thin metal film.

In the above apparatus, the metal component in the solution has a total amount ranging from 30 to 90 weight %.

The above apparatus further comprises a supplementary drying device for drying the solvent in the solution on the surface of the substrate. The supplementary drying device is effective to completely dry the organic solvent that cannot be dried out by a spin drying (air-drying) process such as a spin coating process, so that voids are prevented from being formed in the thin metal film.

According to still another aspect of the present invention, there is provided a method of forming a thin metal film, comprising: preparing an ultrafine particle dispersion liquid containing ultrafine particles at least partly made of metal, the ultrafine particles being dispersed into a solvent; ejecting the ultrafine particle dispersion liquid in a vacuum atmosphere from an ejection nozzle toward a surface of a substrate to evaporate the solvent in the solution to cause the ultrafine particles to collide with the surface of the substrate; and bonding the metal, of which at least a part of the ultrafine particles is made, on the surface of the substrate.

With the above method, a thin metal film composed of only the metal, of which at least a part of the ultrafine particles is made, can uniformly be formed on the surface of the substrate in intimate contact therewith.

In the above method, the metal is brought into collision with the surface of the substrate in a naked state, or ionized in a naked state and accelerated at a predetermined voltage to be brought into collision with the surface of the substrate. The ionized metal can easily and reliably be introduced to embed grooves or plugs having an aspect ratio of 5 or more.

In the above method, the ultrafine particles comprise composite ultrafine metal particles each having a core substantially made of a metal component and a covering layer made of an organic compound chemically bonded to the core.

According to still another aspect of the present invention, there is provided an apparatus for forming a thin metal film, comprising: a processing chamber which can be evacuated; a substrate holder disposed in the processing chamber for holding a substrate; a heater housed in the substrate holder for heating the substrate held by the substrate holder; and an ultrafine particle ejector head having an ejection nozzle disposed in the processing chamber for ejecting an ultrafine particle dispersion liquid containing ultrafine particles at least partly made of metal toward a surface of the substrate held by the substrate holder, the ultrafine particles being dispersed into a solvent.

The above apparatus further comprises at least one of a device for bringing the metal, of which at least part of the ultrafine particles is made, of the ultrafine particle; dispersion liquid ejected from the ultrafine particle ejector head with the solvent being evaporated, into a naked state, and a device for ionizing the metal in the naked state.

In the above apparatus, the ultrafine particles comprise composite ultrafine metal particles each having a core substantially made of a metal component and a covering layer made of an organic compound chemically bonded to the core.

According to yet another aspect of the present invention, there is provided a method of forming a thin metal film, comprising: placing a thin-film precursor on one surface of a film thereby to form a transfer sheet; transferring the transfer sheet onto a surface of a base; and thermally decomposing the transfer sheet and the film to form a thin metal film from the thin-film precursor on the surface of the base.

With the above method, a thin metal film can stably be formed on the surface of the base from the thin-film precursor according to a relatively simple process including the step of transferring the transfer sheet and the step of thermally decomposing the transfer sheet and the film.

In the above method, the base comprises a substrate having recesses defined in a surface thereof for embedding a conductor therein; the transfer sheet is transferred onto the surface of the substrate with the recesses filled up with a portion of the thin-film precursor; and after the thin metal film is formed, the surface of the substrate is polished to remove an excessive thin metal film therefrom.

With the above method, the metal contained in the thin-film precursor can reliably be embedded in the recesses, and the surface of the substrate is then polished to form interconnections of the metal.

In the above method, the thin-film precursor is composed of an ultrafine particle dispersion liquid comprising uniformly dispersed ultrafine particles having an average diameter ranging from 1 to 20 nm; and the ultrafine particles have at least a portion made of metal. With this method, it is possible to form a uniform thin metal film of pure metal on the surface of the substrate.

In the above method, the ultrafine particles comprise composite ultrafine metal particles each having a core substantially made of a metal component and a covering layer made of an organic compound chemically bonded to the core.

In the above method, the thin-film precursor is composed of an ultrafine particle dispersion liquid comprising uniformly dispersed ultrafine particles having an average diameter ranging from 1 to 50 nm; and the ultrafine particles have at least a portion made of metal.

In the above method, the ultrafine particles comprise composite ultrafine metal particles each having a core substantially made of a metal component and a covering layer made of an organic compound chemically bonded to the core.

In the above method, the film is made of an organic material of C, H, O, and N. When the transfer sheet and the film are thermally decomposed, the film can easily be gasified, and the gas does not chemically bonded to the produced thin metal film.

According to yet still another aspect of the present invention, there is provided a method of forming a thin metal film, comprising: placing a thin-film precursor on one surface of a film thereby to form a transfer sheet; transferring the transfer sheet onto a surface of a base; and peeling the film and thermally decomposing the transfer sheet to form a thin metal film from the thin-film precursor on the surface of the base.

In the above method, the base comprises a substrate having recesses defined in a surface thereof for embedding a conductor therein; the transfer sheet is transferred onto the surface of the substrate with the recesses filled up with a portion of the thin-film precursor; and after the thin metal film is formed, the surface of the substrate is polished to remove an excessive thin metal film therefrom.

In the above method, the thin-film precursor is composed of an ultrafine particle dispersion liquid comprising uniformly dispersed ultrafine particles having an average diameter ranging from 1 to 20 nm; and the ultrafine particles have at least a portion made of metal.

In the above method, the ultrafine particles comprise composite ultrafine metal particles each having a core substantially made of a metal component and a covering layer made of an organic compound chemically bonded to the core.

In the above method, the thin-film precursor is composed of an ultrafine particle dispersion liquid comprising uniformly dispersed ultrafine particles having an average diameter ranging from 1 to 50 nm; and the ultrafine particles have at least a portion made of metal.

In the above method, the ultrafine particles comprise composite ultrafine metal particles each having a core substantially made of a metal component and a covering layer made of an organic compound chemically bonded to the core.

In the above method, the film is made of an organic material of C, H, O, and N.

According to a further aspect of the present invention, there is provided an apparatus for forming a thin metal film, comprising: a transfer device for transferring a transfer sheet comprising a thin-film precursor placed on one surface of a film, onto a surface of a base; and a heating device for thermally decomposing the transfer sheet or the transfer sheet and the film to form a thin metal film from the thin-film precursor on the surface of the base.

In the above apparatus, the base comprises a substrate having recesses defined in a surface thereof for embedding a conductor therein; the transfer sheet is transferred onto the surface of the substrate with the recesses filled up with a portion of the thin-film precursor; and the apparatus further comprises a polishing device for, after the thin metal film is formed, polishing the surface of the substrate to remove an excessive thin metal film therefrom.

In the above apparatus, the thin-film precursor is composed of an ultrafine particle dispersion liquid comprising uniformly dispersed ultrafine particles having an average diameter ranging from 1 to 20 nm; and the ultrafine particles have at least a portion made of metal.

In the above apparatus, the ultrafine particles comprise composite ultrafine metal particles each having a core substantially made of a metal component and a covering layer made of an organic compound chemically bonded to the core.

In the above apparatus, the thin-film precursor is composed of an ultrafine particle dispersion liquid comprising uniformly dispersed ultrafine particles having an average diameter ranging from 1 to 50 nm; and the ultrafine particles have at least a portion made of metal.

In the above apparatus, the ultrafine particles comprise composite ultrafine metal particles each having a core substantially made of a metal component and a covering layer made of an organic compound chemically bonded to the core.

In the above apparatus, the film is made of an organic material of C, H, O, and N.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIGS. 2A through 2C are cross-sectional views showing successive steps of a method of forming a thin metal film according to the present invention;

FIG. 11 is a vertical cross-sectional view of an apparatus for forming a thin metal film according to another embodiment of the present invention;

FIGS. 13A through 13F are vertical cross-sectional views showing a modification of the method of forming a thin metal film shown in FIGS. 12A through 12F;

DETAILED DESCRIPTION OF THE PREFERRED EMBODIMENTS

Figure 1A:
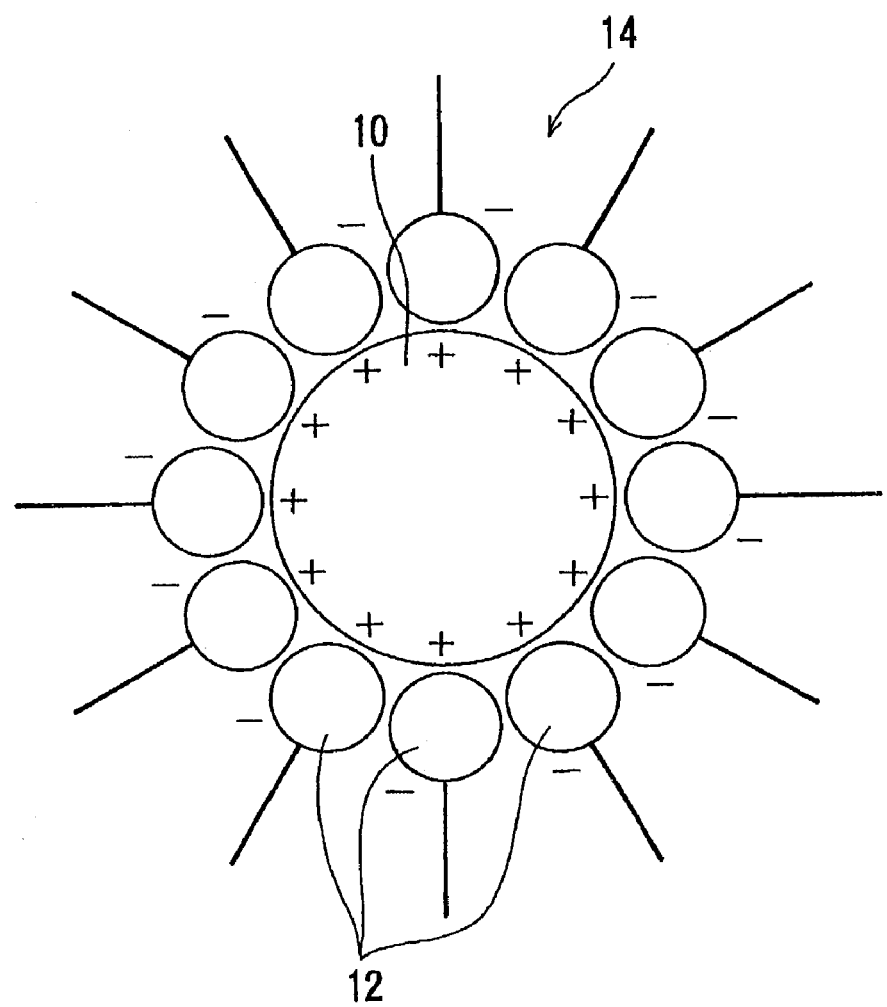
FIGS. 1A and 1B are schematic views showing the structure of an ultrafine particle as a raw material.
Figure 1B:
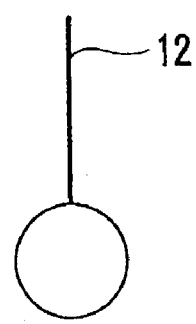

As shown in FIGS. 1A and 1B, a composite ultrafine metal particle 14 comprising a core 10 substantially made of a metal component and a covering layer 12 made of an organic compound is prepared. The composite ultrafine metal particle 14 is stable because it has the covering layer 12 made of an organic compound, and is less liable to be aggregated in a solvent.

The composite ultrafine, metal particle 14 is composed of the organic compound and the metal component which derives from a metal salt as a starting material, e.g., a carbonate, a formate, or an acetate. The core 10 is made of the metal component, and surrounded by the covering layer 12 of the ionic organic compound. The organic compound and the metal component are partly or wholly chemically coupled to each other. The composite ultrafine metal particle 14 is highly stable, and stable in a higher metal concentration, unlike the conventional ultrafine particles which are stabilized by being coated with a surface active agent.

The core 10 has an average diameter ranging from 1 to 50 nm, preferably from 1 to 20 nm, and more preferably from 1 to 10 nm. With this structure, the core 10 can be melted at a temperature that is considerably lower than the melting point of the metal of the core 10.

The composite ultrafine metal particle 14 can be manufactured by heating a metal salt, e.g., a carbonate, a formate, or an acetate at or higher than its decomposing reducing temperature and at or lower than the decomposing temperature of a ionic organic compound in a nonaqueous solvent in the presence of the ionic organic compound.

The metal component comprises at least one of Cu, Ag, Au, Zn, In, Si, Sn, Pd, Fe, Co, Ni, Ru, Rh, Os, Ir, Pt, Cr, Mo, Ba, Bi, Al, W, Ta, Ti, and Pb. The ionic organic compound comprises a fatty acid, an alkylbenzenesulfonic acid, or an alkylsulfonic acid whose carbon number is 5 or more.

The temperature at which the metal salt is heated is equal to or higher than the decomposing reducing temperature of the metal salt, e.g., a carbonate, a formate, or an acetate, and equal to or lower than the decomposing temperature of the ionic organic compound. For example, since the decomposing temperature of silver acetate is 200° C., silver acetate may be held at a temperature equal to or higher than 200° C. at which the ionic organic compound is not decomposed. In order to make the ionic organic compound resistant to decomposition, the atmosphere in which the metal salt is heated should preferably be an inactive gas atmosphere. However, the metal salt may be heated in the atmosphere by selecting a nonaqueous solvent.

For heating the metal salt, any of various alcohols may be added for promoting the reaction. The alcohols that can be added are not limited to any particular alcohol insofar as they can promote the reaction, and may include lauryl alcohol, glycerin, ethylene glycol, etc. The amount of an alcohol that is added may be determined depending on the type of the alcohol added. Usually, 5 to 20 parts by weight, preferably 5 to 10 parts by weight, of an alcohol may be added to 100 parts by weight of the metal salt.

After the metal salt is heated, it is refined by any of various known refining processes including the centrifugal separation process, the membrane refining process, the solvent extracting process, etc.

FIGS. 2A through 2C show successive steps of a method of forming a thin metal film using the composite ultrafine metal particles 14 shown in FIGS. 1A and 1B.

As shown in FIG. 2A, a metal powder 16 of silver, copper, iron, etc. whose average particle diameter ranges from 1 to 10 μm, preferably is about 8 μm, is uniformly dispersed in an ultrafine particle dispersion liquid 15 which comprises composite ultrafine metal particles 14 dispersed in a given organic solvent, thus preparing a solution 17 containing a metal component. When the composite ultrafine metal particles 14 are mixed and stirred, the ultrafine particle dispersion liquid 15 is substantially transparent as the dispersed composite ultrafine metal particles 14 are very small. The properties, such as surface tension, viscosity, etc. of the ultrafine particle dispersion liquid 15 can be adjusted by selecting the type of the solvent, the concentration of the composite ultrafine metal particles 14, and the temperature of the ultrafine particle dispersion liquid 15.

If a thin metal film having a relatively small thickness is to be formed, then the solution 17 comprises a dilute solution which contains 30 weight % of the metal component. If a thin metal film having a relatively large thickness is to be formed, then the solution 17 comprises a dense solution which contains 90 weight % of the metal component. In this manner, the thickness of the thin metal film is adjusted by adjusting the total amount of the metal component in the solution.

Then, as shown in FIG. 2B, the solution 17 is brought into contact with the surface of a substrate 18, and then the organic solvent in the solution 17 applied to the surface of the substrate 18 is evaporated. The above cycle is repeated several times as desired to form an ultrafine particle coating layer 19 of a desired thickness which comprises the composite ultrafine metal particles 14 and the metal powder 16.

The solution 17 may be brought into contact with the surface of the substrate 18 by an immersion process, a spray coating process, or a spin coating process. According to the immersion process, the solution 17 is put into a receptacle, and the substrate 18 is immersed in the solution 17 in the receptacle. According to the spray coating process, the solution 17 is sprayed to the substrate 18. According to the spin coating process, the solution 17 is dropped onto the substrate 18, and the substrate 18 is then rotated. Regions of the substrate surface which are not to be coated may be masked. The solvent may be dried off at normal temperature or with heat.

Then, as shown in FIG. 2C, the ultrafine particle coating layer 19 is thermally decomposed at about 300° C. to melt and join cores 10 (see FIG. 1A) of the metal component of the composite ultrafine metal particles together, thus forming a thin metal film 20 which is composed of the cores 10 and the metal powder 16 and has a thickness ranging from 10 to 1000μm, preferably from 10 to 200 μm. Specifically, when the ultrafine metal particles are heated to a temperature equal to or higher than the temperature at which the covering layer (organic compound) 12 is separated from the core 10 or the decomposing temperature of the covering layer 12, the covering layer 12 is separated from the core 10 or the covering layer 12 is decomposed and disappear, and at the same time the cores 10 are melted and joined together.

At this time, the cores 10 serve as a solder and the metal powder 16 as a skeleton. Since the melted cores 10 and the metal powder 16 are held in close contact with each other, the thin metal film 20 has a high conductivity. Because the metal powder 16 used is relatively inexpensive, it is possible to easily and inexpensively manufacture a thin metal film 20 which is of an increased thickness, whose thickness can easily be adjusted, and which has a high conductivity.

While the metal powder 16 is uniformly dispersed in the ultrafine particle dispersion liquid 15 to produce the solution 17 in the above example, the ultrafine particle dispersion liquid 15 may be used directly as the solution 17. According to this modification, a thin metal film whose thickness ranges from 0.01 to 10 μm is formed which is composed of only melted and joined cores of the metal component by thermally decomposition of the composite ultrafine metal particles.

The composite ultrafine metal particles may be replaced with an organic metal compound, and the organic metal compound and a metal powder may be uniformly dispersed in an organic solvent to prepare a solution containing a metal component. In this case, it is necessary to reduce the organic metal compound into ultrafine metal particles. The organic metal compound may be reduced using a reducing agent or in its own reducing decomposing reaction with heat.

The organic metal compound collectively refers to organic compounds containing various metals, and may include a fatty acid salt such as naphthenate, octanoate, stearate, benzoate, paratoluate, n-decanoate, or the like, a metal alkoxide such as isopropoxide, ethoxide, or the like, and acetylacetone complex salts of the above metals.

FIGS. 3 through 10 show an apparatus for carrying out the above method of forming a thin metal film.

Figure 3:
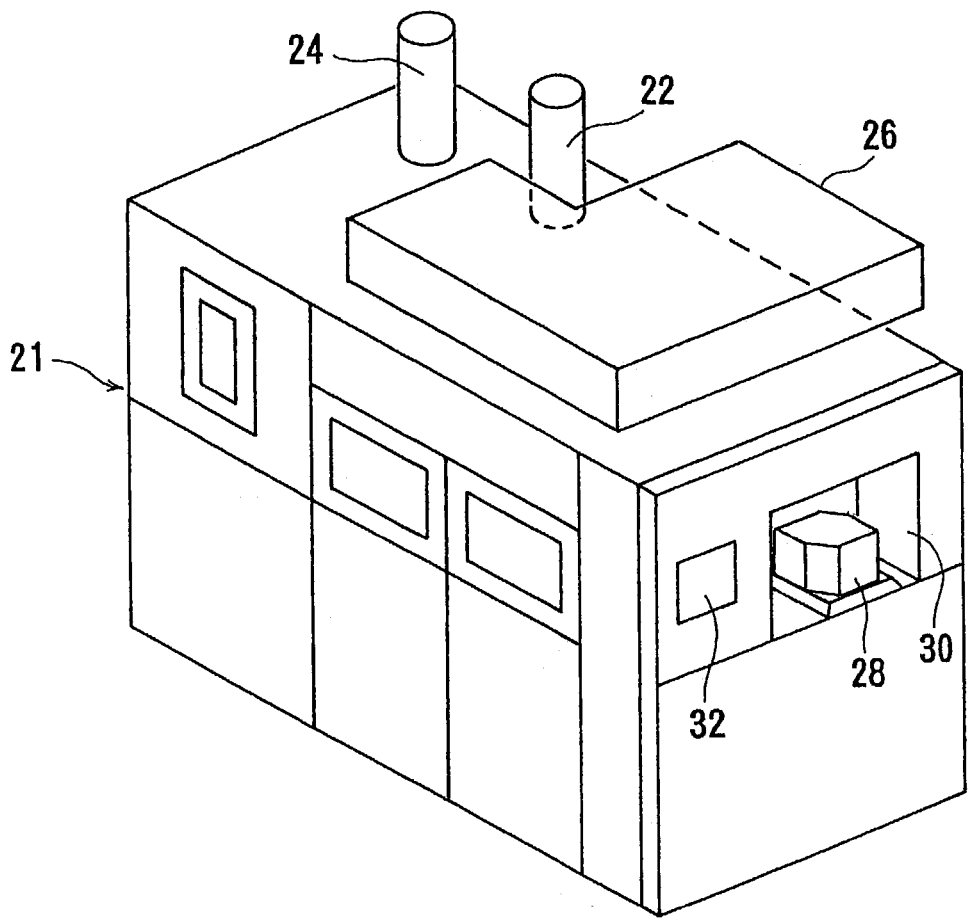
FIG. 3 is a perspective view of an apparatus for carrying out the method of forming a thin metal film shown in FIGS. 2A through 2C.

FIG. 3 shows a rectangular indoor facility 21 which houses the apparatus for forming a thin metal film therein. The rectangular indoor facility 21 has two air discharge ducts 22, 24 and an air-conditioning device 26 which are mounted on the ceiling thereof. The rectangular indoor facility 21 also has, on a side wall thereof, an inlet/outlet port 30 for placing a cassette 28 housing substrates 18 therethrough into and out of the rectangular indoor facility 21, and a control panel 32.

Figure 4:
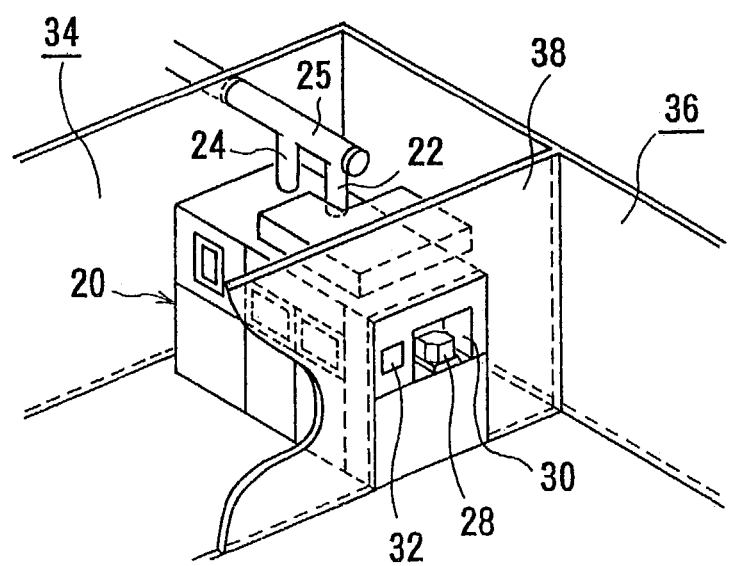
FIG. 4 is a perspective view showing the apparatus shown in FIG. 3 which is placed in a clean room.

As shown in FIG. 4, the rectangular indoor facility 21 is disposed in a utility zone 34 in a clean room which is separated from a clean zone 36 by a partition wall 38, for example. The rectangular indoor facility 21 has an end positioned in an opening defined in the partition wall 38, with the inlet/outlet port 30 and the control panel 32 exposed in the clean zone 36. The air discharge ducts 22, 24 are connected to a single common air discharge duct 25, which is extends out of the utility zone 34.

Figure 5:
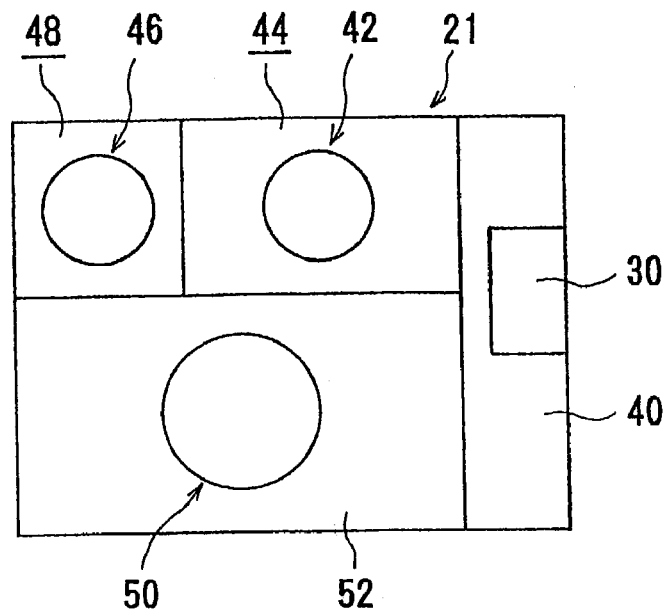
FIG. 5 is a plan view of the apparatus shown in FIG. 3.

As shown in FIG. 5, the rectangular indoor facility 21 has its interior divided into a loading/unloading section 40 having the inlet/outlet port 30, a solution supply section 44 having a solution supply device 42 therein, a supplementary drying section 48 having a supplementary drying device 46 therein, and a heating section 52 having a heating device 50 therein. The solution supply device 42, the supplementary drying device 46, the heating device 50 are arranged in a sequence along the direction in which substrates are fed, so that steps of forming a thin metal film can successively be performed. While the rectangular indoor facility 21 is shown as having one inlet/outlet port for holding one cassette therein, the rectangular indoor facility 21 may have two inlet/outlet ports each holding respective cassettes therein.

Figure 6:
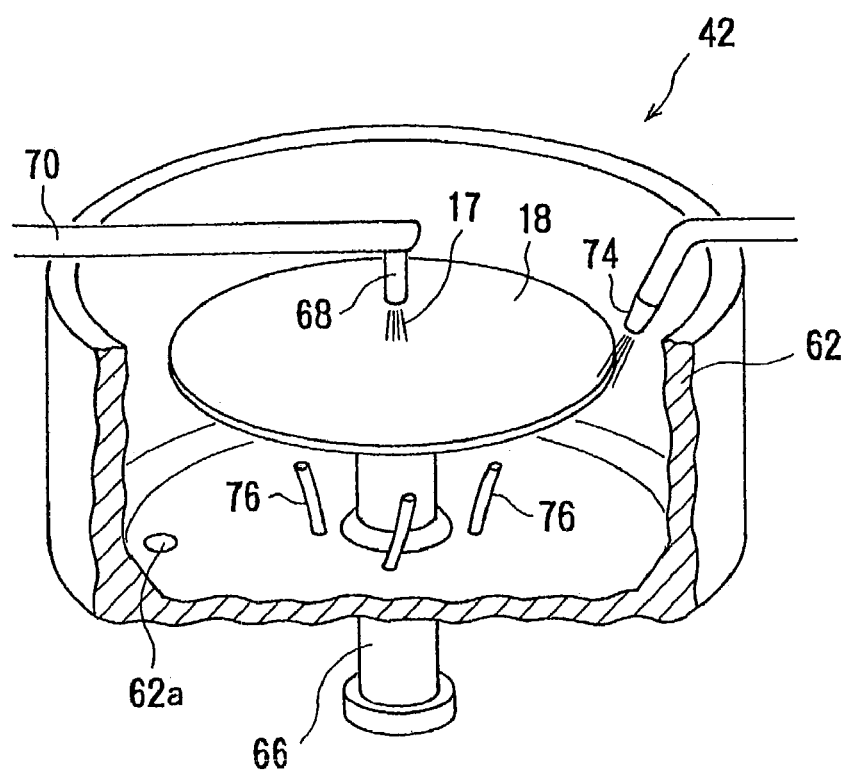
FIG. 6 is a perspective view, partly broken away, of a solution supply device of the apparatus shown in FIG. 3.
Figure 7:
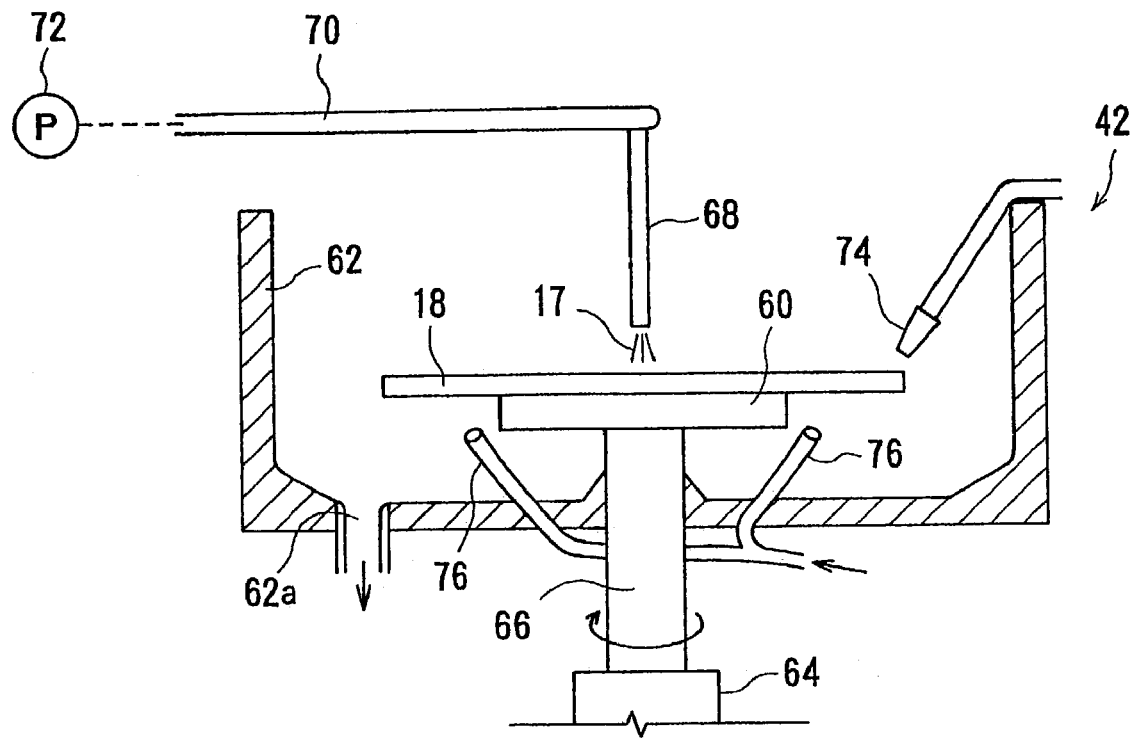
FIG. 7 is a vertical cross-sectional view of the solution supply device shown in FIG. 6.

FIGS. 6 and 7 show the solution supply device 42 which supplies the solution 17 (see FIG. 2A) to the surface of the substrate 18. The solution supply device 42 comprises a substrate holder 60 for holding and rotating the substrate 18 with an interconnection forming surface thereof facing upwardly, and a bottomed cup-shaped scattering prevention member 62 surrounding the substrate 18 that is held by the substrate holder 60. The substrate holder 60 has a vacuum chuck for attracting and holding the substrate 18 on its upper surface, and is connected to the upper end of a rotatable shaft 66 that extends upwardly from a servomotor 64. When the servomotor 64 is energized, the substrate holder 60 is rotated about its own axis. The bottomed cup-shaped scattering prevention member 62 is made of a material resistant to an organic solvent, e.g., stainless steel.

The solution supply device 42 includes a solution supply nozzle 68 positioned above either the center of the surface of the substrate 18 held by the substrate holder 60 or a position slightly displaced from the center of the surface of the substrate 18. The solution supply nozzle 68 is oriented downwardly to drop the solution 17 onto the substrate 18. The solution supply nozzle 68 is connected to the free end of an arm 70 which houses therein a pipe extending from a constant-quantity supply device 72 such as a syringe pump or the like for supplying a metered amount of solution 17. The pipe in the arm 70 is held in communication with the solution supply nozzle 68 for supplying a metered amount of solution 17 from the constant-quantity supply device 72 to the solution supply nozzle 68.

The solution supply device 42 also includes a bevel cleaning nozzle 74 extended radially downwardly above the peripheral edge of the substrate 18 held by the substrate holder 60 for supplying a cleaning liquid to a bevel portion of the substrate 18, and a plurality of reverse side cleaning nozzles 76 extended radially outwardly below the substrate 18 held by the substrate holder 60 for supplying a gas or a cleaning liquid to the backside of the substrate 18. The bottomed cup-shaped scattering prevention member 62 has a drain hole 62a defined in its bottom.

When the servomotor 64 is energized, the substrate 18 held by the substrate holder 60 is rotated at a rotational speed of 300 to 500 rpm, preferably 400 to 500 rpm. At the same time, a desired amount of solution 17 is supplied from the solution supply nozzle 68 and dropped onto the central region of the surface of the substrate 18. When the surface of the substrate 18 is covered with the solution 17, the supply of the solution 17 from the solution supply nozzle 68 is stopped. In this manner, the solution 17 is uniformly coated on the surface of the substrate 18. At this time, a hydrophilic organic solvent such as methanol or acetone, or a cleaning liquid such as ethanol or isopropyl alcohol is supplied from the bevel supply nozzle 74 to the bevel portion of the substrate 18, for thereby preventing the outer circumferential surface and the backside surface of the substrate 18 from being coated with the solution 17. A gas such as an $N_2$ gas or air, or a cleaning liquid which is the same as the cleaning liquid supplied from the bevel supply nozzle 74 is supplied from the backside cleaning nozzle 76 to the backside of the substrate 18 to prevent the backside of the substrate 18 from being contaminated.

With the supply of the solution 17 being stopped, the servomotor 64 is energized to rotate the substrate 18 to spin-dry the substrate 18 with air, thereby evaporating the solvent from the solution 17 coated on the substrate 18.

The above process of coating the solution 17 on the interconnection forming surface of the substrate 18 and then drying the solution 17 with air is repeated a plurality of times as desired. The process is stopped when the ultrafine particle coating layer 19, as shown FIG. 2A, is deposited to a desired thickness.

The substrate 18 may finally be rotated at a higher rotational speed to promoting the drying process of the solvent. Any excessive solution 17 and the cleaning liquid that has been used to clean the bevel portion of the substrate 18 and the backside of the substrate 18 are discharged out of the bottomed cup-shaped scattering prevention member 62 through the drain hole 62*a*.

Figure 8:
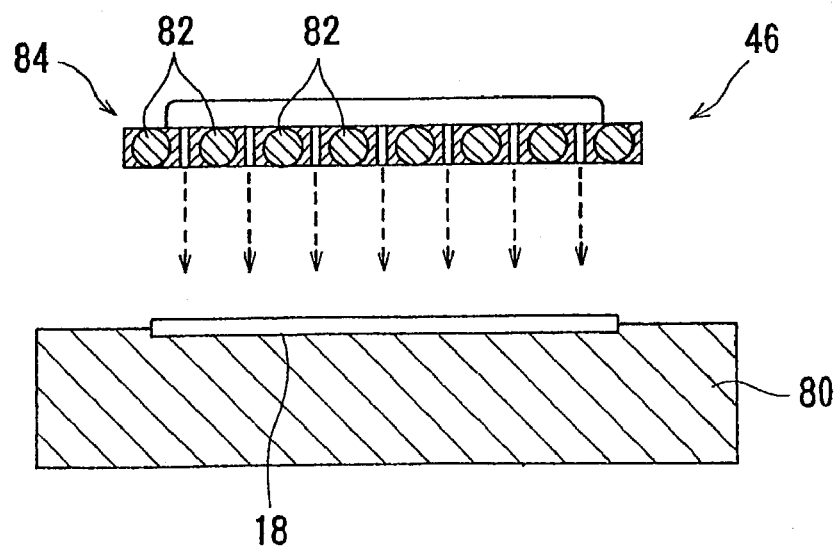
FIG. 8 is a cross-sectional view of a supplementary drying device of the apparatus shown in FIG. 3.

FIG. 8 shows the supplementary drying device 46 in cross section. The supplementary drying device 46 comprises a substrate holding base 80 for holding the substrate 18 with its surface facing upwardly and a heating device 84 having lamp heaters 82 disposed above the substrate holding base 80, for example.

The supplementary drying device 46 serves to dry out the solvent that has not been fully evaporated by the solution supply device 42. If the solution 17 is coated to a very small thickness on the surface of the substrate 18 or the solvent has been fully evaporated by the solution supply device 42, then the supplementary drying device 46 may be dispensed with.

Specifically, if the ultrafine particle coating layer 19 (see FIG. 2B) deposited on the surface of the substrate 18 were heated while the organic solvent is remaining in the ultrafine particle coating layer 19, then voids would tend to be formed in the thin metal film. Such voids are prevented from being formed in the thin metal film by fully drying out the solvent in the supplementary drying device 46. The supplementary drying device 46 heats the ultrafine particle coating layer 19 at a temperature where the ultrafine particles are not decomposed, e.g., at a temperature of about 100° C., so that the supplementary drying device 46 is prevented from being contaminated by decomposed ultrafine particles.

Figure 9:
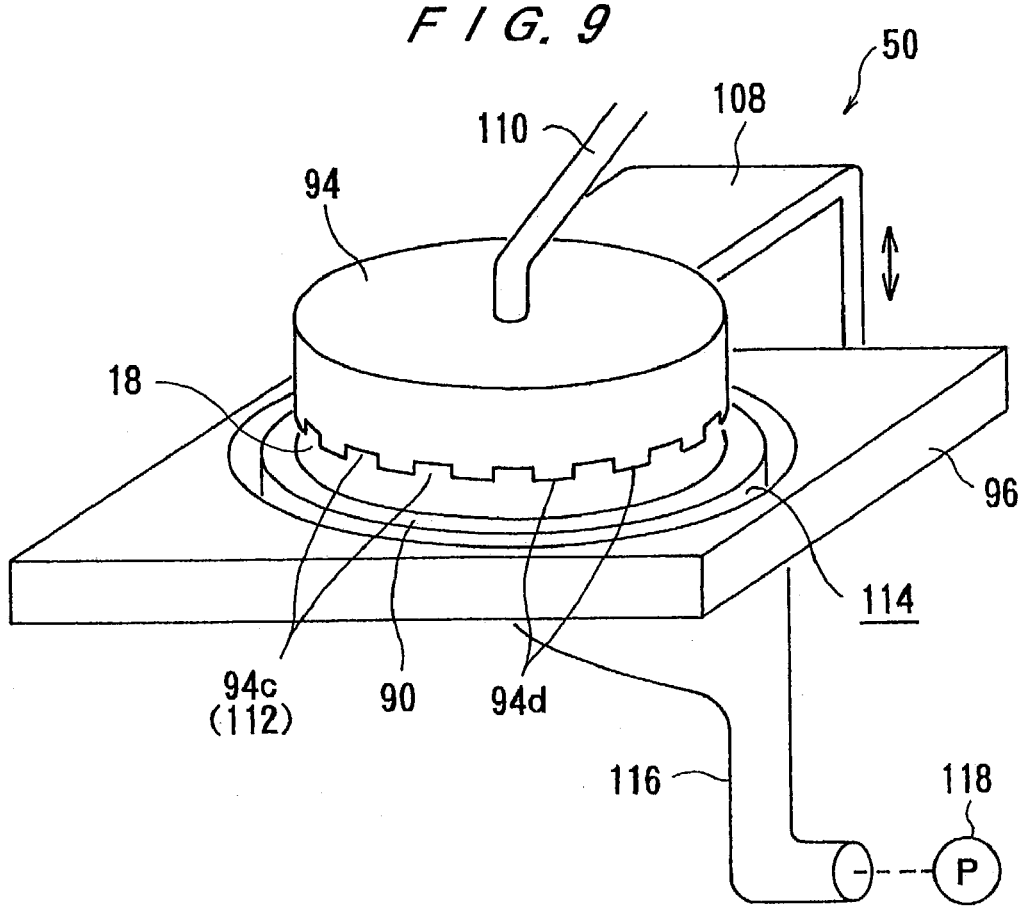
FIG. 9 is a vertical cross-sectional view of a heating device of the apparatus shown in FIG. 3.
Figure 10:
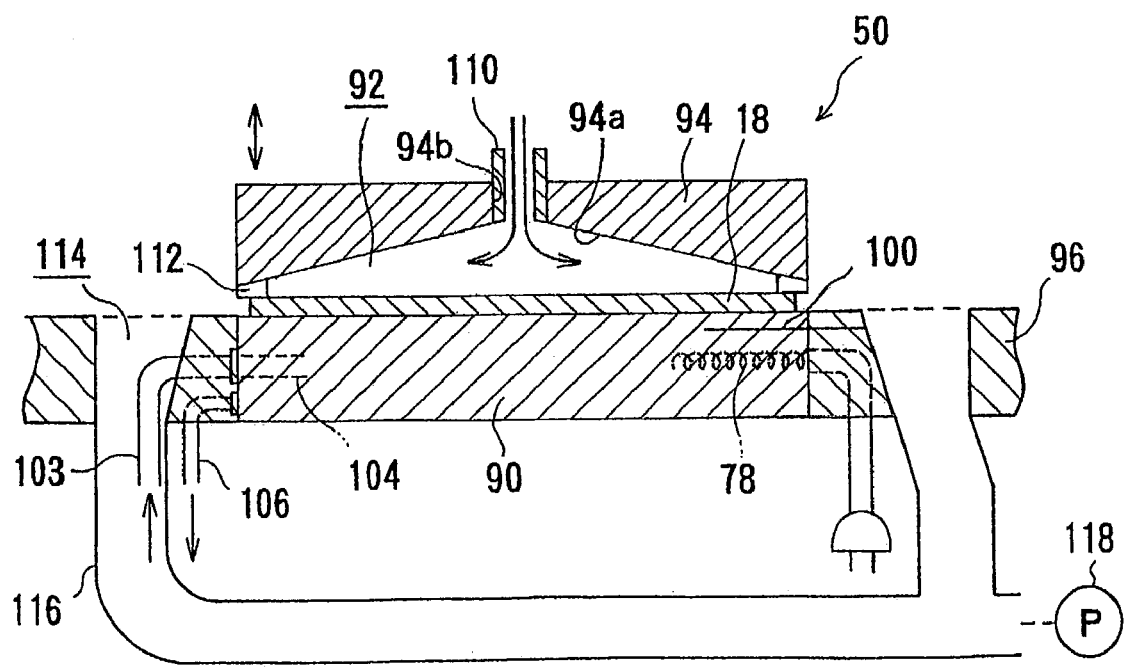
FIG. 10 is a vertical cross-sectional view of the heating device of the apparatus shown in FIG. 3.

FIGS. 9 and 10 show the heating device 50 which heats the ultrafine particle coating layer 19 (see FIG. 2B) to melt the composite metal ultrafine particles and join them together. The heating device 50 comprises a heating plate 90 for holding and heating the substrate 18 with its surface facing upwardly, a housing 94 for surrounding a space above the substrate 18 held by the heating plate 90 to define a gas chamber 92 between itself and the heating plate 90, and a frame 96 surrounding the periphery of the heating plate 90.

The heating plate 90 is in the form of a disk of aluminum or copper that is of a high thermal conductivity and can be heated uniformly at a high speed. The heating plate 90 houses therein a heater 98 and a temperature sensor 100 for detecting the temperature of the heating plate 90. The heating plate 90 also has a coolant passage 104 defined therein which communicates with a coolant inlet pipe 103 for introducing a coolant such as a cooling gas, air, or the like. The coolant passage 104 communicates with a coolant discharge pipe 106.

The housing 94 is made of ceramics, for example, and fixed to the free end of a vertically movable arm 108. The housing 94 has a conical recess 94*a* defined in the lower surface thereof which defines a gas chamber 92 between itself and the substrate 18 placed on and held by the heating plate 90. The housing 94 also has a gas supply port 94*b* defined centrally therein and connected to a gas supply pipe 110. The housing 94 further has slit portions 94*c* and pressing portions 94*d* alternately formed on the lower peripheral edge thereof. When the housing 94 is lowered, the pressing portions 94*d* contact the peripheral edge of the substrate 18 on the heating plate 90, gripping the peripheral edge of the substrate 18 between the pressing portions 94*d* and the heating plate 90. At this time, the slit portions 94*c* provide a gas discharge port 112 on the peripheral edge of the substrate 18.

The frame 96 has a ring-shaped gas intake port 114 defined therein. A discharge duct 116 is fixed to the lower surface of the frame 96 in communication with the gas inlet port 114. The discharge duct 116 is connected to a discharge blower 118.

The heating device 50 operates as follows. The substrate 18 is placed on the upper surface of the heating plate 90. The heating plate 90 heats the substrate 18 to 300° C., for example, in 5 minutes. After the substrate 18 is kept at 300° C. for 5 minutes, it is cooled to the room temperature in 10 minutes. In this manner, the cores 10 of the metal component of the composite ultrafine metal particles 14 are melted and joined together. An inactive gas of $N_2$ or the like containing a small amount of oxygen or ozone is introduced from the gas supply pipe 110 into the gas chamber 92, and thereafter an inactive gas of $N_2$ or the like alone is introduced from the gas supply, pipe 110 into the gas chamber 92. The introduced oxygen or ozone serves as a catalyst for separating the organic substance and the metal from each other thereby to promote the decomposition of the composite ultrafine metal particles 14. The $N_2$ gas serves to remove soot produced when the composite ultrafine metal particles 14 are decomposed, from the surface of the substrate 18, for thereby preventing the surface of the substrate 18 from being contaminated by soot.

The oxygen or ozone should be introduced in a small quantity because if it were introduced in a large quantity, it would tend to oxidize the composite ultrafine metal particles 14.

If interconnections are to be formed using ultrafine cupper particles, then the substrate 18 is heated (baked) while a nitrogen gas containing a small amount of oxygen or ozone is being introduced, and then a nitrogen gas containing hydrogen is introduced to prevent the cupper from being oxidized. After interconnections of pure copper are formed, a nitrogen gas is introduced. In this manner, interconnections can be formed efficiently.

The apparatus for forming a thin metal film, which is constructed as described above, operates as follows. The cassette 28 with substrates 18 housed therein is placed into the inlet/outlet port 30, and one of the substrates 18 is taken from the cassette 28 into the solution supply device 42 in the solution supply section 44. The solution supply device 42 supplies the solution 17 containing a metal component to the surface of the substrate 18, and dries the substrate 18 by spin-drying process, thereby evaporating the solvent from the solution 17 coated on the substrate 18. The above process of coating and drying the solution 17 is repeated a plurality of times as desired. When the ultrafine particle coating layer 19 (see FIG. 2B) is deposited to a desired thickness, the substrate 18 is fed to the supplementary drying device 46 in the supplementary drying section 48. The supplementary drying device 46 evaporates the solvent in the ultrafine particle coating layer 19. Thereafter, the substrate 18 is fed to the heating device 50 in the heating section 52. The heating device 50 heats the ultrafine particle coating layer 19 to melt and join the metal cores together, thereby forming the thin metal film 20 (see FIG. 2C), after which the substrate 18 is returned to the cassette 28. The apparatus according to the present invention is capable of performing the above steps successively.

FIG. 11 shows an apparatus for forming a thin metal film according to another embodiment of the present invention. The apparatus has a processing chamber 120 which can be evacuated by a vacuum pump (not shown) connected to an evacuating port 120a. The processing chamber 120 houses therein a substrate holder 122 disposed vertically movably and rotatably for placing a substrate 18 on its upper surface. The substrate holder 122 accommodates therein a heater 124 for heating the substrate 18 held by the substrate holder 122 and a cooling mechanism for cooling the substrate 18 with cooling water. A liquid nitrogen trap device 126 is disposed below the substrate holder 122 in the processing chamber 120.

An ultrafine particle ejector head 130 having a number of ejection nozzles 130a defined in a lower surface thereof is positioned above the substrate holder 122 in the processing chamber 120. The ultrafine particle ejector head 130 is connected to an ultrafine particle dispersion liquid passage 132 which introduces an ultrafine particle dispersion liquid into the processing chamber 120. The ultrafine particle dispersion liquid which is supplied from an external source is uniformly ejected from the ejection nozzles 130a toward the surface of the substrate 18 that is held by the substrate holder 122.

Between the substrate holder 122 and the ultrafine particle ejector head 130, there is disposed an openable/closable shutter 134 that is rotatable to open and close a region above the substrate holder 122.

In this embodiment, the ultrafine particle dispersion liquid comprises, as shown in FIGS. 1A and 1B, composite ultrafine metal particles 14, each having a core 10 substantially made of a metal component and a covering layer 12 made of an organic compound, uniformly dispersed in a suitable solvent of cyclohexane or the like. The composite ultrafine metal particles 14 are stable because the cores 10 are covered with the covering layers 12 made of an organic compound, and have a small tendency to be aggregated in a solvent. The core 10 has an average diameter ranging from 1 to 50 nm, preferably from 1 to 20 nm, and more preferably from 1 to 10 nm.

The ultrafine particle ejector head 130 is connected to a high-frequency power supply 140, and acts as a discharge electrode for generating a plasma in a plasma generating region 142 below the ultrafine particle ejector head 130. An electron beam generator 144 for applying an electron beam inwardly is positioned laterally and downwardly of the plasma generating region 142. The electron beam generator 144 may be replaced with an ion generator.

A method of forming a thin metal film, carried out by the apparatus shown in FIG. 11, to form copper interconnections on the semiconductor substrate 18 using an ultrafine particle dispersion liquid which comprises ultrafine copper particles (composite ultrafine metal particles) dispersed in cyclohexane will be described below. Each of the ultrafine copper particles comprises a core 10 of copper covered with a covering layer 12 of an organic compound. For example, the ultrafine copper particles can be produced by adding a stearic acid as an anionic substance and copper carbonate as a metal source to a paraffin-based high-boiling-point solution having an initial boiling point of 250° C., heating the mixture at 300° C. for 3 hours, adding methanol to the mixture, and subjecting the mixture to precipitation refinement.

First, the substrate 18 is placed on the upper surface of the substrate holder 122, and heated to a desired temperature by the heater 124. Then, the processing chamber 120 is evacuated to keep under vacuum atmosphere in the processing chamber 120. The ultrafine particle dispersion liquid is introduced into the ultrafine particle ejector head 130, and ejected through the ejection nozzles 130a to the surface of the substrate 18. At the same time, the high-frequency power supply 140 applies high-frequency electric energy to the ultrafine particle ejector head 130 to produce a plasma in the plasma generating region 142, and the shutter 134 is opened. When necessary, the electron beam generator 144 is energized to ionize the ultrafine particles.

The solvent contained in the ultrafine particle dispersion liquid ejected through the ejection nozzles 130a is quickly vaporized, and either trapped by the liquid nitrogen trap device 126 or discharged via the evacuating port 120a by the vacuum pump. The ultrafine copper particles that have been left upon evaporation of the solvent pass through the plasma generating region 142, and are heated upon passage through the plasma generating region 142. When heated, the covering layer 12 of the organic compound (see FIGS. 1A and 1B) is decomposed and disappears, producing an ultrafine particle beam composed of highly active copper alone (core 10).

Since the copper cores 10 are uniformly dispersed in the solvent stably out of contact with each other, the ultrafine copper particles which are of a very small diameter can easily be handled, and the ultrafine particle beam composed of copper (core 10) has a uniform distribution.

The electron beam is applied to the ultrafine particle beam to ionize the ultrafine particle beam into an ultrafine particle ion beam, which is accelerated, if necessary, with a given voltage into collision with the surface of the substrate 18. Because the copper cores 10 are very active and the substrate 18 is heated by the heater 124, the copper cores 10 are melted and joined together, forming and depositing a uniform, spot-free copper film on the surface of the substrate 18 in intimate contact therewith.

Figure 16A:
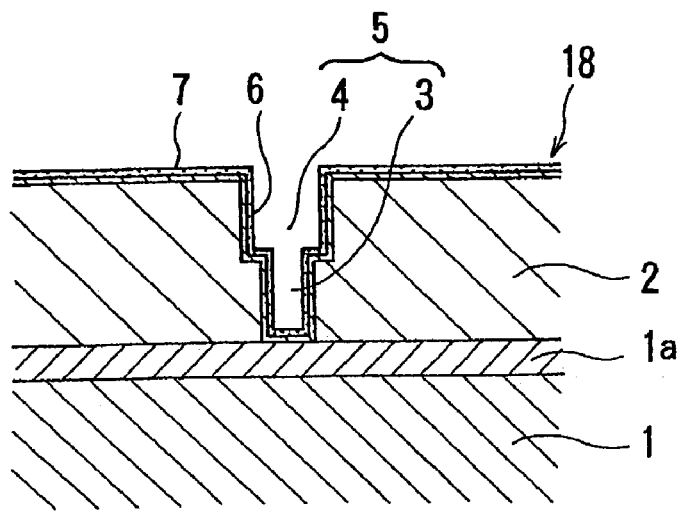
FIGS. 16A through 16C are vertical cross-sectional views showing successive steps of a basic method of manufacturing interconnections of a semiconductor device by plating the surface of a semiconductor substrate with copper.
Figure 16B:
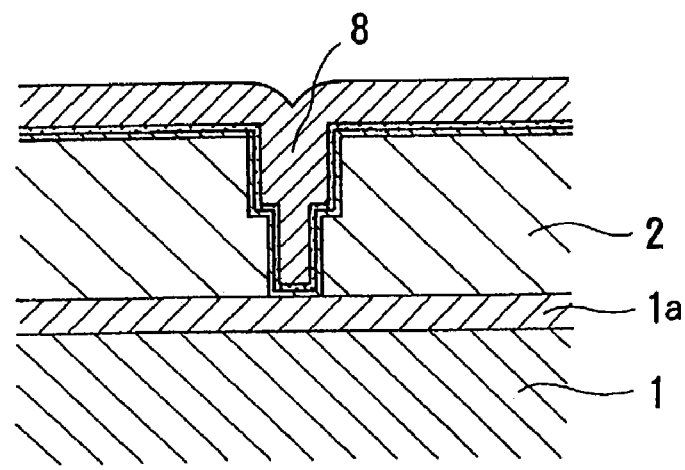
Figure 16C:
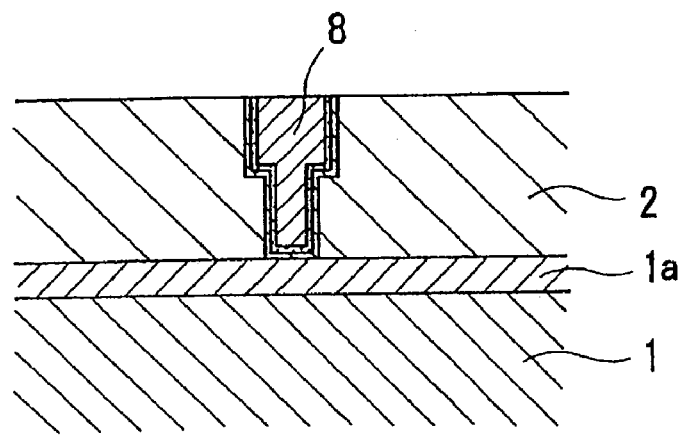

Heretofore, as shown in FIGS. 16A through 16C, after the diffusion barrier layer 6 and the base film 7 have successively been formed on the small recesses 5, the surface of the substrate is plated with copper. According to the method carried out by the apparatus shown in FIG. 11, however, the diffusion barrier layer 6 and the primary film 7 are not formed, but a copper layer is deposited directly on the surface of the insulating film 2 in intimate contact therewith to form copper interconnections free of voids and seals therein.

When the copper cores 10 are ionized and the energy to accelerate the ions is optimized, it is possible to embed copper in contact holes whose aspect ratio is 5 or more.

As indicated by the imaginary lines in FIG. 11, a laser beam source 150 may be positioned outside of the processing chamber 120, and the processing chamber 120 may have a window 152 made of a material capable of passing a laser beam generated by the laser beam source 150. With this modification, the laser beam that has passed through the window 152 is applied to the composite ultrafine metal particles 14, from which the solvent has been evaporated, to remove the covering layers 12. The laser beam may be replaced with an ultraviolet ray. Alternatively, a particle beam such as an electron beam, an ion beam, or a neutron beam may be applied to remove the covering layers 12 from the composite ultrafine metal particles 14, from which the solvent has been evaporated.

In the above embodiments, the composite ultrafine metal particles 14 are used as ultrafine particles, and the ultrafine particle dispersion liquid is prepared by dispersing the composite ultrafine metal particles 14 in the solvent. However, the composite ultrafine metal particles 14 may be replaced with generally known ultrafine particles made of metal only, and the ultrafine particle dispersion liquid may be prepared by dispersing the known ultrafine particles in the solvent.

FIGS. 12A through 12F show successive steps of a method of forming a thin metal film according to another embodiment of the present invention. According to this method, a conductor such as copper, silver, or the like is embedded in interconnection grooves defined in the surface of the semiconductor substrate or small recesses such as vertical holes interconnecting layers, known as contact holes, making up interconnections of the embedded conductor.

Figure 12A:
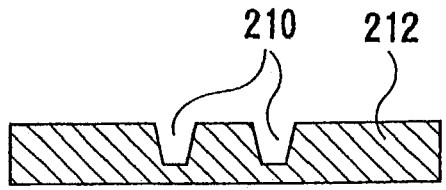
FIGS. 12A through 12F are vertical cross-sectional views showing successive steps of a method of forming a thin metal film according to another embodiment of the present invention.
Figure 12B:
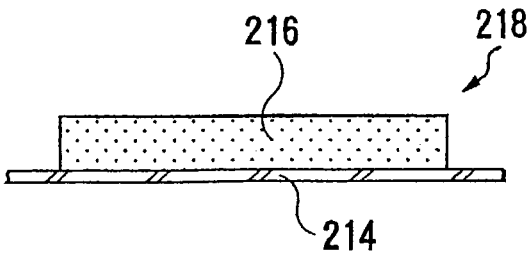

As shown in FIGS. 12A and 12B, there are prepared a substrate 212 having small recesses 210 such as interconnection grooves formed by lithography and etching, and a transfer sheet 218 comprising a film 214 of synthetic resin, for example, and a thin-film precursor 216 of given thickness deposited on one surface of the film 214.

The thin-film precursor 216 is prepared from a paste-like ultrafine particle dispersion liquid which comprises composite ultrafine metal particles 14, each comprising a core 10 substantially made of a metal component and a covering layer 12 made of an organic compound, uniformly dispersed in a given solvent, as shown FIGS. 1A and 1B, in this embodiment. The composite ultrafine metal particles 14 are stable because the cores 10 are covered with the covering layers 12 made of an organic compound, and have a small tendency to be aggregated in a solvent.

The proportion of the metal component in the composite ultrafine metal particles 14 may be normally in the range from 50 to 90 weight %. For use in interconnection grooves, it is preferable for the metal component to be in the range from 60 to 90 weight %, particularly from 70 to 90 weight %. The core 10 has an average diameter ranging from 1 to 50 nm, preferably from 1 to 20 nm, and more preferably from 1 to 10 nm.

When the composite ultrafine metal particles 14 are mixed and stirred, the thin-film precursor (ultrafine particle dispersion liquid) 216, which is prepared by uniformly dispersing the composite ultrafine metal particles 14 in the solvent, is substantially transparent as the dispersed composite ultrafine metal particles 14 are very small. The properties, such as surface tension, viscosity, etc. of the thin-film precursor 216 can be adjusted by selecting the type of the solvent, the concentration of the composite ultrafine metal particles 14, and the temperature of the thin-film precursor 216.

The film 214 is made of an organic material such as polyethylene composed of C, H, O only or an organic material such as nylon composed of C, H, O, N only. If the film 214 is made of an organic material composed of C, H, O, N only, then when the film 214 is thermally decomposed, it can easily be gasified, and the generated gas and a formed thin film 232 (see FIG. 12E) are not chemically bonded together.

Figure 12C:
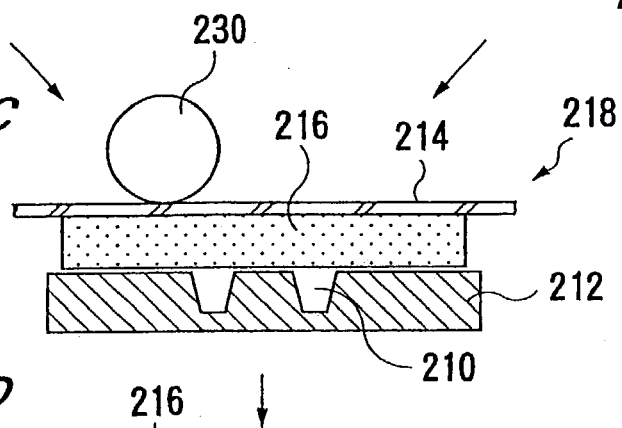
Figure 12D:
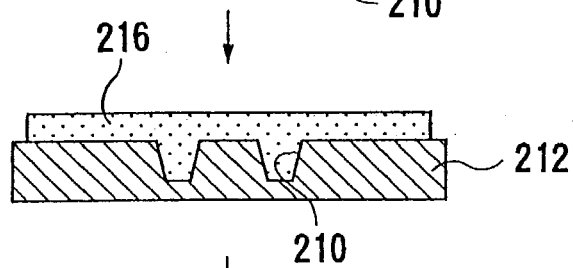
Figure 12E:
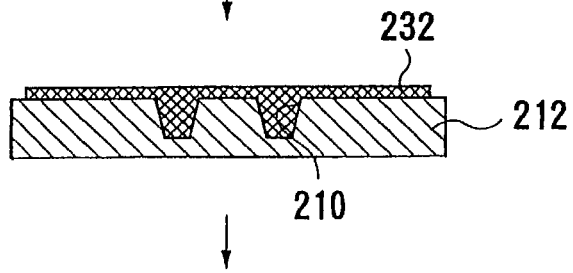

Then, as shown in FIG. 12C, the surface of the substrate 212 where the recesses 210 are defined and the thin-film precursor 216 on the transfer sheet 218 are brought into contact with each other, and then pressed against each other by a pressure roller 230. As shown in FIG. 12D, the thin-film precursor 216 is transferred to the substrate 212 with the recesses 210 filled up with a portion of the thin-film precursor 216.

Then, after the film 214 is peeled off the thin-film precursor 216, a thin metal film 232 is formed from the thin-film precursor 216 on the surface of the substrate 212 where the recesses 210 are defined. Specifically, the solvent contained in the thin-film precursor (ultrafine particle dispersion liquid) 216 is evaporated, and the covering layers (organic compound) 12 (see FIGS. 1A and 1B) of the composite ultrafine metal particles 14 are decomposed away. At the same time, the cores 10 of the metal component are melted and joined together, forming a thin metal film 232 made of only the metal component contained in the thin-film precursor 216.

At this time, the recesses 210 in the substrate 212 are fully filled up with a portion of the thin-film precursor 216 that is pressed. In this manner, a conductor free of voids and cavities is formed in the recesses 210 in the substrate 212.

Figure 12F:
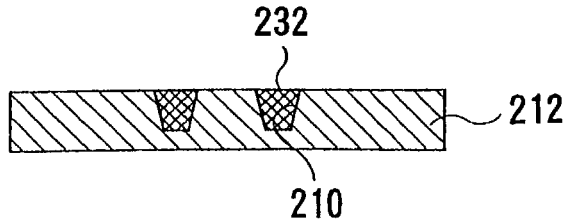

Then, as shown in FIG. 12F, the surface of the substrate is polished by chemical mechanical polishing (CMP) to remove the excessive thin metal film 232, other than the thin metal film 232 filled in the recesses 210, from the substrate 212. Embedded interconnections made of the thin metal film 232 are now fabricated.

FIGS. 13A through 13F show a modification of the method of forming a thin metal film shown in FIGS. 12A through 12F. The modified method differs from the method shown in FIGS. 12A through 12F in that, as shown in FIG. 13D, the film 214 is not peeled off the thin-film precursor 216, but is thermally decomposed to form a thin metal film 232 from the thin-film precursor 216 on the surface of the substrate 212 where the recesses 210 are defined, as shown in FIG. 13E. Specifically, the film 214 is gasified away, and the solvent contained in the thin-film precursor (ultrafine particle dispersion liquid) 216 is evaporated, and the covering layers (organic compound) 12 (see FIGS. 1A and 1B) of the composite ultrafine metal particles 14 are decomposed away. At the same time, the cores 10 of the metal component are melted and joined together, forming a thin metal film 232 made of only the metal component contained in the thin-film precursor 216.

Figure 14:
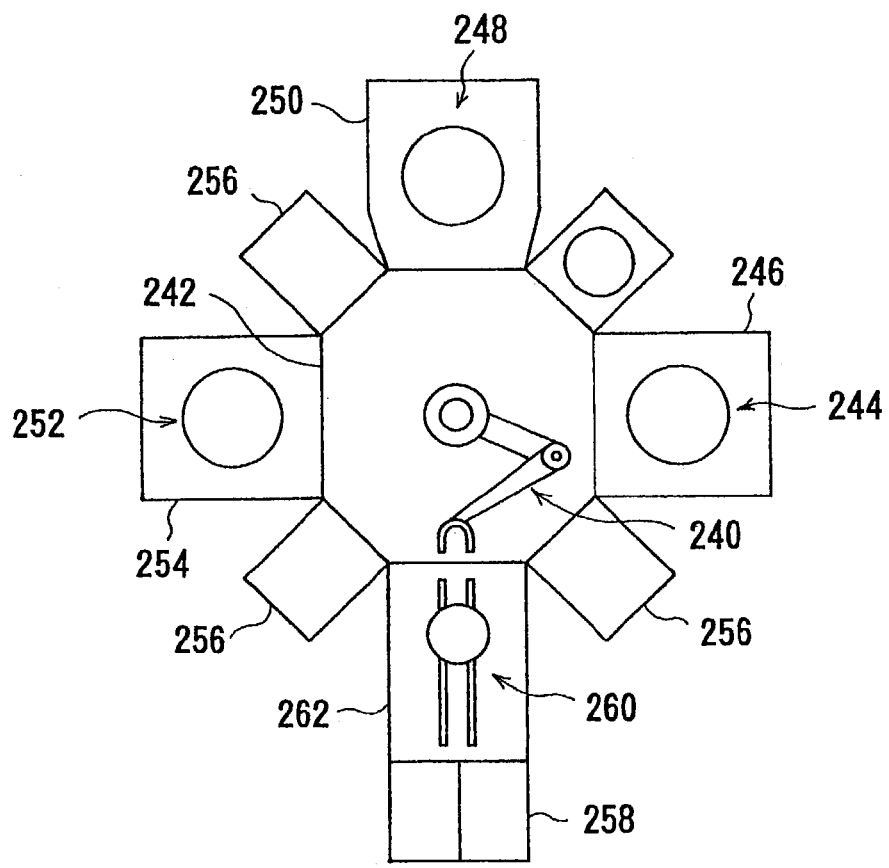
FIG. 14 is a plan view of an apparatus for carrying out the methods shown in FIGS. 12A through 12F and 13A through 13F.
Figure 15:
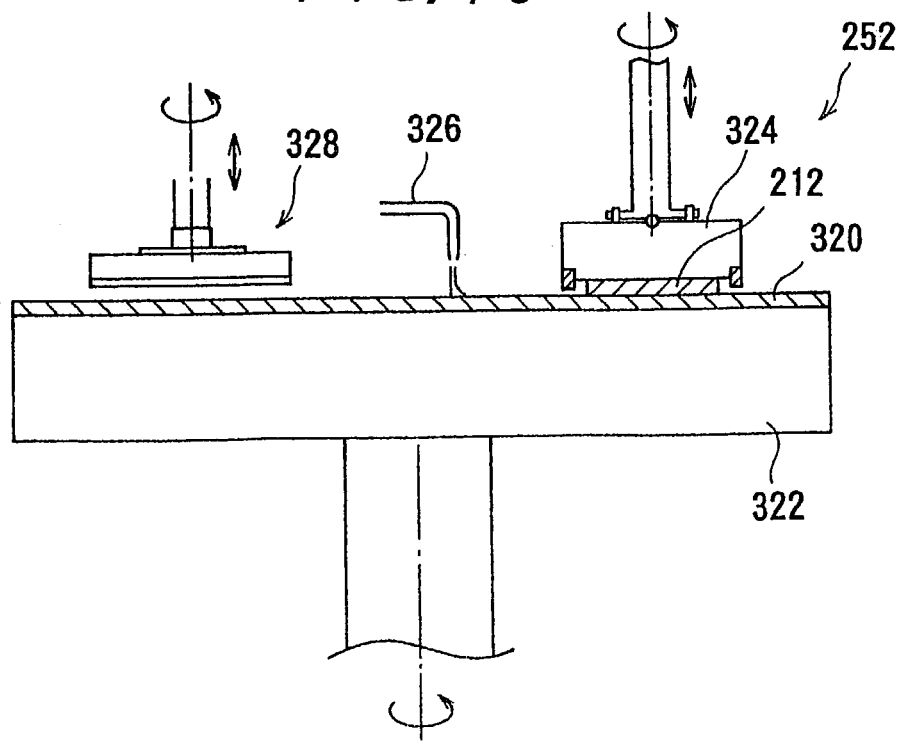
FIG. 15 is an elevational view, partly in cross section, of a polishing device of the apparatus shown in FIG. 14.

FIGS. 14 and 15 show an apparatus for carrying out the methods shown in FIGS. 12A through 12F and 13A through 13F.

As shown in FIGS. 14 and 15, the apparatus comprises a central feed chamber 242 having a feed robot 240 disposed therein, a transfer section 246 housing a transfer device 244 therein, a heating section 250 housing a heating device 248 therein, a polishing chamber 254 housing a polishing device 252 therein, and a plurality of stock yards (temporary stock chambers) 256. The transfer section 246, the heating section 250, the polishing chamber 254, and the stock yards 256 are disposed radially outwardly of the central feed chamber 242, with the stock yards 256 being positioned between the transfer section 246, the heating section 250, and the polishing chamber 254. The apparatus also includes a second feed chamber 262 disposed between the feed chamber 242 and a loading/unloading chamber 258 and housing a movable robot 260.

As shown in FIGS. 12C and 13C, the transfer device 244 brings the surface of the substrate 212 where the recesses 210 are defined and the thin-film precursor 216 on the transfer sheet 218 into contact with each other, and then presses the substrate 212 and the thin-film precursor 216 against each other with the pressure roller 230, for thereby transferring the thin-film precursor 216 to the substrate 212 with the recesses 210 filled up with a portion of the thin-film precursor 216, as shown in FIGS. 12D and 13D.

The heating device 248 is of a structure identical to the heating device 50 shown in FIGS. 9 and 10. In the heating device 248, after the film 214 is peeled off the thin-film precursor 216, or with the film 214 remaining unremoved on the thin-film precursor 216, the substrate 212 is placed on the upper surface of the heating plate 90. The heating plate 90 heats the substrate 18 to 300° C. in 5 minutes. After the substrate 18 is kept at 300° C. for 5 minutes, it is cooled to the room temperature in 10 minutes. In this manner, the cores of the metal component of the composite ultrafine metal particles are melted and joined together.

The polishing device removes excessive metal from the surface of the substrate 212 in a chemical mechanical polishing action. As shown in FIG. 15, the polishing device comprises a polishing table 322 with a polishing pad 320 attached to its upper surface to provide a polishing surface, and a top ring 324 for holding the substrate 212 with its surface to be polished facing toward the polishing table 322. The polishing table 322 and the top ring 324 are rotated about their own axes independently of each other. While an abrasive liquid is being supplied from an abrasive liquid nozzle 326 positioned above the polishing table 322 to the polishing pad 320, the top ring 324 presses the substrate 212 against the polishing pad 320 under a constant pressure to polish the surface of the substrate 212. The abrasive liquid supplied from the abrasive liquid nozzle 326 comprises an alkaline solution with fine abrasive particles of silica or the like suspended therein. Therefore, the surface of the substrate 212 is polished to a flat mirror finish by a chemical mechanical polishing action which is a combination of a chemical polishing action performed by the alkali and a mechanical polishing action performed by the fine abrasive particles.

Continued polishing of substrates on the polishing device results in a reduction of the polishing capability of the polishing surface of the polishing pad 320 due to the loading of the polishing pad 320. To recover the polishing capability, the polishing pad 320 is dressed by a dresser 328 when the polished substrate 212 is replaced with another substrate 212, for example. Specifically, the lower dressing surface of the dresser 328 is pressed against the polishing pad 320, and the dresser 328 and the polishing table 322 are independently rotated about their own axes to remove the abrasive liquid and debris from the polishing pad 320. The polishing surface of the polishing pad 320 is thus planarized and dressed into a regenerated state.

The transfer section 246 housing the transfer device 244 therein, the heating section 250 housing the heating device 248 therein, and the polishing chamber 254 housing the polishing device 252 therein can be unitized, and the processes in the transfer section 246, the heating section 250, and the polishing chamber 254 can individually be performed and combined to form interconnections on substrates.

In the above embodiment, the composite ultrafine metal particles 14 are used as ultrafine particles, and the ultrafine particle dispersion liquid for the thin-film precursor is prepared by dispersing the composite ultrafine metal particles 14 in the solvent. However, the composite ultrafine metal particles 14 may be replaced with generally known ultrafine particles made of metal only, and the ultrafine particle dispersion liquid may be prepared by dispersing the known ultrafine particles in the solvent.

With the arrangement of the present invention, it is possible to easily and inexpensively manufacture a thin metal film which has a sufficient conductivity and whose thickness can easily be adjusted. A thin metal film of good quality can stably be formed on the surface of a substrate to embed a conductor reliably in small interconnection grooves or recesses defined in the surface of the substrate.

Although certain preferred embodiments of the present invention have been shown and described in detail, it should be understood that various changes and modifications may be made therein without departing from the scope of the appended claims.

What is claimed is:

1. A method of forming a thin metal film on a surface of a substrate, comprising:
    preparing a metal film precursor containing composite ultrafine metal particles each having a core substantially made of a metal component, said core having an average diameter ranging from 1 to 50 nm;
    placing the metal film precursor on a film made of organic material to produce a transfer sheet,
    bringing a surface of a substrate into contact with the metal film precursor of the transfer sheet; and
    thermally decomposing the transfer sheet to gasify the film of the transfer sheet and join the cores of the composite ultrafine metal particles together, thereby forming a metal film on the surface of the substrate.

2. A method according to claim 1, wherein said substrate has recesses in the surface thereof, and further comprising pressing the transfer sheet on the substrate so that the metal film precursor fills up to said recesses before the heating.

3. A method according to claim 2, further comprising polishing a surface of the metal film formed on the surface of the substrate after the heating to remove excessive metal film and to form a conductor in the recesses.

4. A method according to claim 1, wherein the composite ultrafine metal particles have a covering layer made of an organic compound chemically bonded to a surface of the core.

5. A method according to claim 4, wherein a metal component in the composite ultrafine metal particles is in the range from 50 to 90 weight %.

6. A method according to claim 1, wherein the composite metal film precursor is in paste form.

7. A method according to claim 1, wherein the material of the transfer sheet is composed of carbon, hydrogen, oxygen, and nitrogen only.

8. A method of forming a thin metal film on a surface of a substrate, comprising:
    preparing a metal film precursor containing ultrafine metal particles,
    placing the metal film precursor on a film made of organic material to produce a transfer sheet,
    contacting a surface of a substrate to the metal film precursor on the transfer sheet; and
    heating the transfer sheet at a temperature sufficient to gasify the film and decompose the metal film precursor so that said ultrafine metal particles join together to form a metal film on the surface of the substrate;
    wherein said substrate has recesses in the surface thereof, and further comprising pressing the transfer sheet on the substrate so that the metal film precursor fills up to said recesses before the heating.

9. A method of forming a thin metal film on a surface of a substrate, comprising:
    preparing a metal film precursor containing ultrafine metal particles, placing the metal film precursor on a film made of organic material to produce a transfer sheet, contacting a surface of a substrate to the metal film precursor on the transfer sheet; and heating the transfer sheet at a temperature sufficient to gasify the film and decompose the metal film precursor so that said ultrafine metal particles join together to form a metal film on the surface of the substrate;

wherein the composite metal film precursor is in paste form containing the ultrafinemetal particles.

* * * * *